(12) United States Patent
Zhang

(10) Patent No.: US 9,202,885 B2
(45) Date of Patent: Dec. 1, 2015

(54) NANOSCALE SILICON SCHOTTKY DIODE ARRAY FOR LOW POWER PHASE CHANGE MEMORY APPLICATION

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Chao Zhang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/201,525

(22) Filed: Mar. 7, 2014

(65) Prior Publication Data

US 2015/0102451 A1    Apr. 16, 2015

(30) Foreign Application Priority Data

Oct. 11, 2013    (CN) .......................... 2013 1 0474009

(51) Int. Cl.
*H01L 29/66* (2006.01)
*H01L 27/08* (2006.01)
(Continued)

(52) U.S. Cl.
CPC .... *H01L 29/66143* (2013.01); *H01L 21/76229* (2013.01); *H01L 27/0814* (2013.01); *H01L 27/1021* (2013.01); *H01L 27/2409* (2013.01); *H01L 29/0649* (2013.01); *H01L 29/872* (2013.01); *H01L 45/06* (2013.01); *H01L 45/16* (2013.01); *H01L 29/47* (2013.01)

(58) Field of Classification Search
CPC ..................................................... H01L 31/07
USPC ...................................... 438/570; 257/5, 471
See application file for complete search history.

(56) References Cited

U.S. PATENT DOCUMENTS

| | | | | |
|---|---|---|---|---|
| 5,856,695 | A * | 1/1999 | Ito et al. | 257/370 |
| 6,690,037 | B1 * | 2/2004 | Desko et al. | 257/109 |

(Continued)

FOREIGN PATENT DOCUMENTS

CN    102412179    *    4/2012    ............ H01L 21/762

*Primary Examiner* — Mohammad Islam
*Assistant Examiner* — Chi-Hua Yang
(74) *Attorney, Agent, or Firm* — Kilpatrick Townsend and Stockton LLP

(57) ABSTRACT

Methods and devices associated with a phase change memory include Schottky diodes operating as selectors having a low turn-on voltage, low sneak current and high switching speed. A method of forming a semiconductor device includes providing a semiconductor substrate having a diode array region and a peripheral device region, forming an N+ buried layer in the diode array region, forming a semiconductor epitaxial layer on the N+ buried layer, and forming deep trench isolations through the epitaxial layer and the N+ buried layer along a first direction. The method also includes forming shallow trench isolations in the diode array region and in the peripheral region along a second line direction. The method also includes forming an N− doped region between the deep and shallow trench isolations and forming a metal silicide on a surface of the N− doped region.

10 Claims, 11 Drawing Sheets

| (51) | Int. Cl. | |
|---|---|---|
| | H01L 29/872 | (2006.01) |
| | H01L 29/06 | (2006.01) |
| | H01L 21/762 | (2006.01) |
| | H01L 45/00 | (2006.01) |
| | H01L 27/24 | (2006.01) |
| | H01L 27/102 | (2006.01) |
| | H01L 29/47 | (2006.01) |

(56) References Cited

U.S. PATENT DOCUMENTS

| 7,307,020 | B2 * | 12/2007 | Leedy | 438/689 |
|---|---|---|---|---|
| 7,485,571 | B2 * | 2/2009 | Leedy | 438/626 |
| 2004/0089908 | A1 * | 5/2004 | Desko et al. | 257/471 |
| 2013/0189799 | A1 * | 7/2013 | Zhang et al. | 438/3 |

* cited by examiner

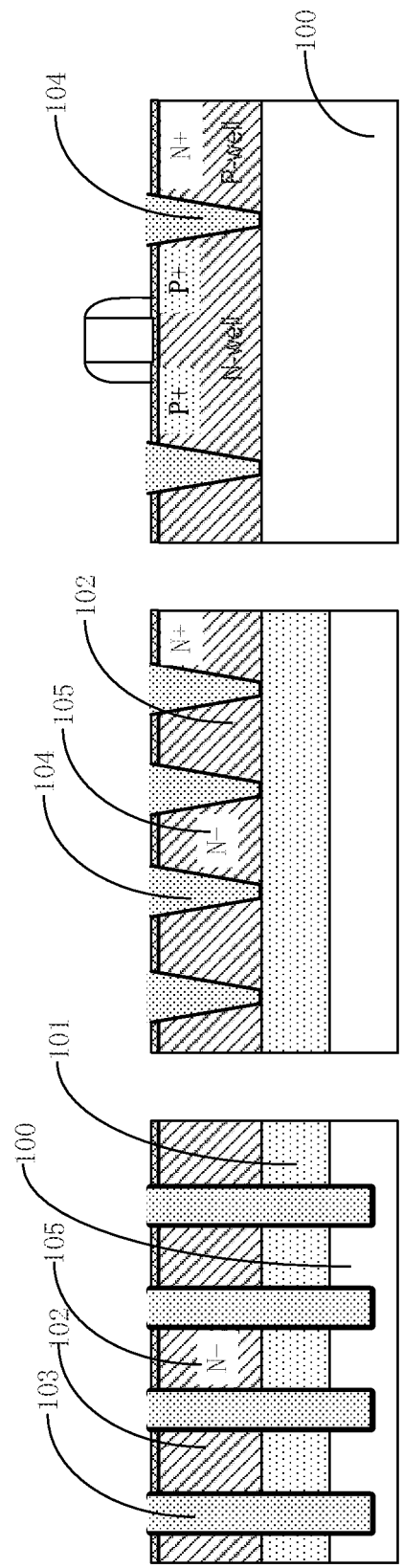

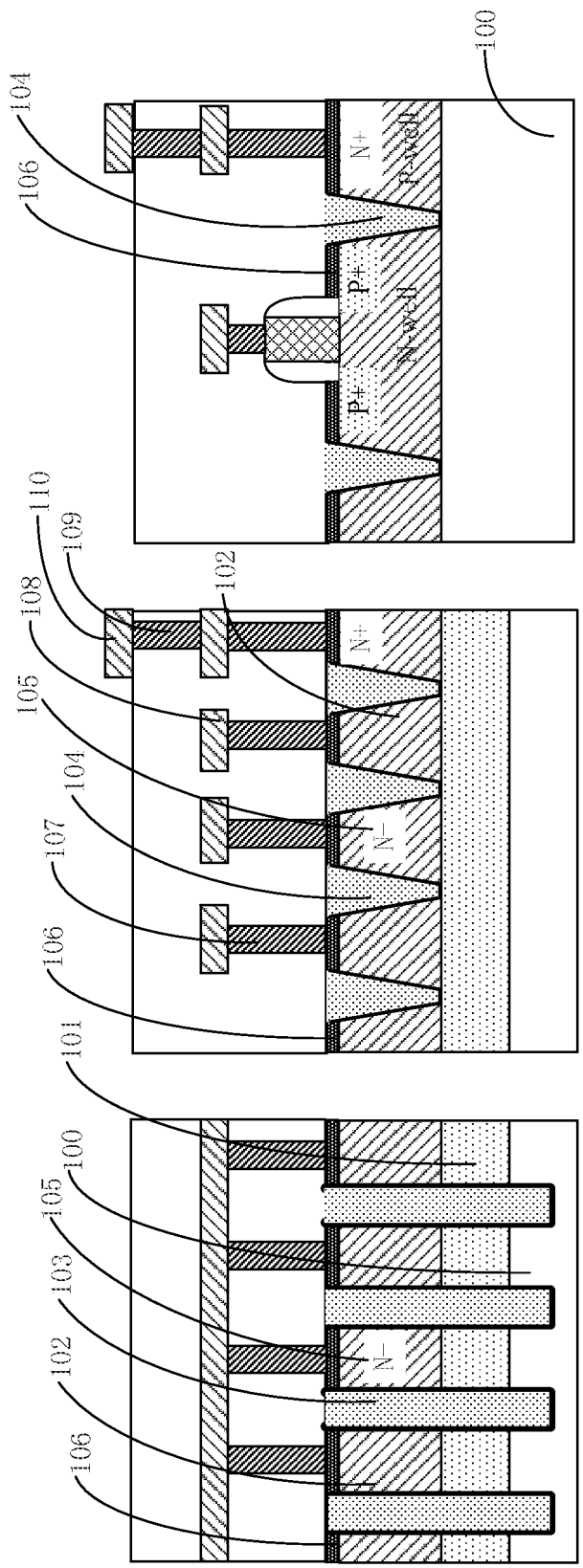

NANOSCALE SILICON SCHOTTKY DIODE ARRAY FOR LOW POWER PHASE CHANGE MEMORY APPLICATION

CROSS-REFERENCES TO RELATED APPLICATIONS

This application claims priority to Chinese Application No. 201310474009.1, filed on Oct. 11, 2013 with the State Intellectual Property Office of People's Republic of China, the content of which is incorporated herein by reference in its entirety.

FIELD OF THE INVENTION

The present invention relates to semiconductor memory devices. More particularly, embodiments of the present invention provide methods and devices of an array of Schottky barrier diodes operating as selectors for a phase change memory device.

BACKGROUND

Phase change random access memory (PCRAM) devices are widely used in electronic appliances as non-volatile memory devices due to their many advantages such as fast read/write access times, a large number of times of read/write operations, long data retention time, small unit area, and others. A PCRAM device typically includes resistance units and selector devices, which are used for selecting memory elements in the phase change memory. A selector device (referred to as selector hereinafter) can be a CMOS field effect transistor type, BJT type, or a PN junction diode type. Because a junction diode has a small cell size and provides a high programming voltage, a PCRAM device with diodes as selectors has a better performance than PCRAM devices with other types of selectors.

With ongoing development of semiconductor manufacturing technology, phase change memory devices are getting more densely integrated. As process nodes go below 40 nm, selectors will become the bottleneck in the manufacture of PCRAM devices. With the reduction in physical size, PN junction diodes have a higher turn-on voltage and sneak current. Thus, in order to use PN junction diodes in a PCRAM device, the problems of high turn-on voltage and sneak current must be solved.

BRIEF SUMMARY OF THE INVENTION

In an effort to solve the aforementioned needs, embodiments of the present invention provide devices and methods of manufacturing the same to reduce the turn-on voltage, the sneak current, and increase the switching speed of the Schottky diodes operating as selectors while utilizing standard CMOS processes without major modifications. The method of manufacturing a semiconductor device having a plurality of Schottky diodes may include providing a P-type semiconductor substrate having a diode array region including the plurality of Schottky diodes and a peripheral device region. The method further includes forming an N+ buried layer in the diode array region, forming a semiconductor epitaxial layer on a portion of the peripheral device region and on the N+ buried layer, and forming a plurality of deep trench isolations through at least the epitaxial layer and the N+ buried layer along a first direction, e.g., the row direction. The method also includes forming a plurality of shallow trench isolations within the diode array region and within the peripheral device region along a second direction, e.g., the column direction, wherein the shallow trench isolation has a depth equal to or greater than a thickness of the epitaxial layer. The method also includes forming an N− doped region within a region of the epitaxial layer disposed between the deep trench isolations and the shallow trench isolations of the diode array region, and forming a metal silicide on the N− doped region.

In an embodiment, forming an N+ buried layer includes performing an ion implantation into the diode array region to form an N+ doped layer, and activating the N+ doped layer.

In an embodiment, the ion implantation has a dose greater than $1.0 \times 10^{14}$ atoms per cm$^2$.

In an embodiment, forming the semiconductor epitaxial layer includes depositing a semiconductor epitaxial layer having a thickness in a range between 1000 angstrom and 6000 angstroms.

In an embodiment, forming the shallow trench isolations comprises forming a plurality of shallow trenches within the epitaxial layer of the diode array region and within the epitaxial layer of the peripheral device region, forming a liner layer overlying the shallow trenches, performing an ion implantation into the liner layer to form a P+ protection layer, subjecting the P+ protection layer to an annealing treatment, filling the shallow trenches with an insulation material, and planarizing the insulation material using a chemical mechanical polishing process.

In an embodiment, performing the ion implantation includes implanting dopants at an energy in a range between 5 KeV and 40 KeV, a dose in a range between $1.0 \times 10^{12}$ to $4.0 \times 10^{15}$ atoms per cm$^2$, and an implant angle in a range of 45 degrees and 70 degrees relative to a surface of the semiconductor substrate. The dopants may be boron, boron fluoride, or indium.

In an embodiment, the annealing treatment is conducted at a temperature in a range between 950° C. and 1100° C. and a time duration in a range between 10 seconds and 3600 seconds.

In an embodiment, forming the N− doped region includes etching a portion of the epitaxial layer disposed between the deep trench isolations and the shallow trench isolations to form a plurality of cylindrical-shaped trenches in a vertical direction relative to the epitaxial layer, and implanting N− ions into the cylindrical-shaped trenches.

In an embodiment, the metal silicide is selected from the group consisting of NiSi$_x$, CoSi$_x$, PtSi$_x$, and TiSi$_x$, where $0.3 \leq x \leq 2$.

In an embodiment, the method further includes, after forming the N− doped region and prior to forming a metal silicide, performing an ion implantation into a surface of the diode array region to adjust a barrier height of the Schottky diodes.

In an embodiment, the ion implantation comprises dopants selected from the group consisting of B, BF$_2$, As, and Sb with a dose in a range between $1.0 \times 10^{12}$ and $4.0 \times 10^{14}$ atoms per cm$^2$.

In one embodiment, the method further includes, after forming a metal silicide, forming bit lines and word lines. The bit lines are connected to the metal silicide through first contact holes, and the word lines are connected to the N+ buried layer through second contact holes.

Embodiments of the present invention also provide a semiconductor device that includes a p-type semiconductor substrate having a peripheral device region and a diode array region. The diode array region includes a plurality of Schottky diodes, each of the Schottky diodes is operating as a selector for a phase change memory element. The semiconductor device also includes a plurality of deep trench isolations and a plurality of shallow trench isolations disposed around the diodes. The Schottky diodes are separated and isolated from each other by the deep trench isolations and the shallow trench isolations.

In an embodiment, each of the plurality of shallow trench isolations includes a P+ protection layer disposed on a bottom and side surfaces of the shallow trench isolation. The P+ protection layer may include boron, boron fluoride, or Indium.

Embodiments of the present invention also provide an electronic device that includes the semiconductor device described above.

Schottky diodes fabricated according to embodiments of the present invention are separated and isolated from each other by a double trench isolation structure, the thus fabricated Schottky diodes have low turn-on voltage, low sneak current and high switching speed. The Schottky diodes according to embodiments of the present invention can be fabricated utilizing standard CMOS processes, thereby reducing the production costs.

The following description, together with the accompanying drawings, will provide a better understanding of the nature and advantages of the claimed invention.

BRIEF DESCRIPTION OF THE DRAWINGS

FIGS. 1A through 1G illustrate simplified cross-sectional views of various process stages associated with forming a semiconductor device according to a first embodiment of the present invention;

DETAILED DESCRIPTION OF THE INVENTION

Figures 1, 1A:
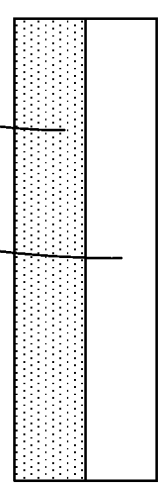

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

The N+ (or n+) layer is highly doped with impurities to a concentration of at least 10E18 ($10^{18}$) atoms per $cm^3$ or a dose of at least 10E14 ($10^{14}$) atoms per $cm^2$. The N− (or n−) layer has a lower doping concentration, but is still an n-type and has an impurity concentration in the range of 10E14 ($10^{14}$) to 10E15 ($10^{15}$) atoms per $cm^3$ or a dose of 10E10 to 10E11 ($10^{10}$ to $10^{11}$) atoms per $cm^2$. The P (or p) layer is lightly doped with impurities to a concentration in the range of 10E14 ($10^{14}$) to 10E15 ($10^{15}$) atoms per $cm^3$ or a dose of 10E10 to 10E11 ($10^{10}$ to $10^{11}$) atoms per $cm^2$. The P+ (or p+) layer is highly doped with impurities to a concentration of at least 10E18 ($10^{18}$) atoms per $cm^3$ or a dose of at least 10E14 ($10^{14}$) atoms per $cm^2$.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, tier example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

According to a first embodiment of the present invention, a semiconductor device may include a phase change random access memory device and diodes operating as selectors for selecting memory elements of the phase change random access memory device. The semiconductor device may include an array of Schottky diodes and a peripheral device containing CMOS circuits and other elements. The Schottky diodes are separated and insulated from each other by a double isolation structure containing deep trench isolations and shallow trench isolations.

Figures 1, 1A, 2:
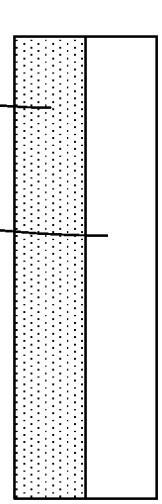

FIGS. 1A through 1G illustrate process steps associated with a method of manufacturing phase change memory cells in accordance with the first embodiment of the present invention. FIG. 1H is a top view of a CMOS device containing a diode array region 1001 and a peripheral device region 1002 according to some embodiments of the present invention.

Figures 1, 1A, 2, 3:
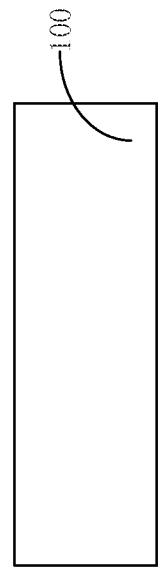

FIG. 3 is a flow chart of a method 300 of manufacturing a semiconductor device according to the first embodiment of the present invention. Method 300 may include the following steps:

A1: provide a p-type semiconductor substrate 100, and define a diode array region 1001 and a peripheral region 1002, as shown in FIG. 1A and FIG. 1H. FIG. 1A includes FIGS. 1A-1 through 1A-3. Referring to FIG. 1A and FIG. 1H, FIG. 1A-1 illustrates a cross-sectional view of diode array region 1001 cut along the B-B line (e.g., along the bit line direction). FIG. 1A-2 illustrates a cross-sectional view of diode array region 1001 cut along the A-A line (e.g., along the word line direction). FIG. 1A-3 illustrates a cross-sectional view of peripheral region 1002. Similarly, in the following, FIG. 1B includes FIGS. 1B-1 through 1B-3 illustrating respective cross-sectional views of diode array region 1001 along the direction of the bit line and the word line, and peripheral region 1002 in a sequential process step. FIG. 1C includes FIGS. 1C-1 through 1C-3 illustrating respective cross-sectional views of diode array region 1001 along the direction of the bit line and the word line, and peripheral region 1002 in a sequential process step. FIG. 1D includes FIGS. 1D-1 through 1D-3 illustrating respective cross-sectional views of diode array region 1001 along the direction of the bit line and the word line, and peripheral region 1002 in a sequential process step. FIG. 1E includes FIGS. 1E-1 through 1E-3 illustrating respective cross-sectional views of diode array region 1001 along the direction of the bit line and the word line, and peripheral region 1002 in a sequential process step. FIG. 1F includes FIGS. 1F-1 through 1F-3 illustrating respective cross-sectional views of diode array region 1001 along the direction of the bit line and the word line, and peripheral region 1002 in a sequential process step. FIG. 1G includes FIGS. 1G-1 through 1G-3 illustrating respective cross-sectional views of diode array region 1001 along the direction of the bit line and the word line, and peripheral region 1002 in a sequential process step. FIG. 1H is a top view illustrating the diode array region 1001 and the peripheral device region 1002.

In this embodiment, diode array region 1001 denotes the region of the diode array of a change phase random access memory device (PCRAM), peripheral region 1002 denotes the region of a conventional CMOS device and other devices, such as NMOS devices, PMOS devices, capacitive elements, resistive elements, sensors, and the like.

In an exemplary embodiment, step A1 may include the following steps:

A11: perform an ion implantation into the diode array region to form an N+ buried layer 101 on semiconductor substrate 100. The ion implantation may have an ion implant dose higher than $1.0 \times 10^{14}$ atoms per cm$^2$.

A12: activate the N+ buried layer.

Figures 1, 1B:
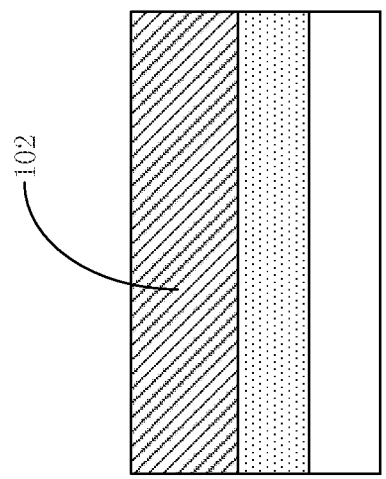
Figures 1, 1B, 2:
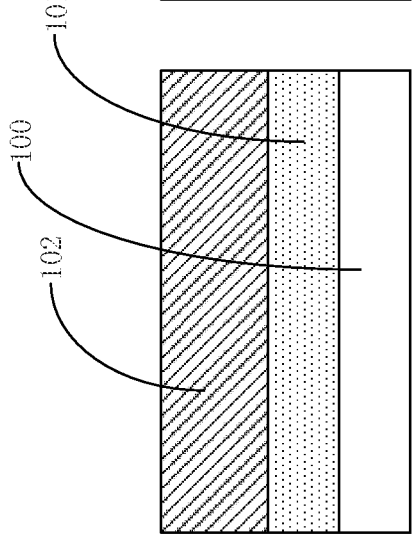
Figures 1, 1B, 2, 3:
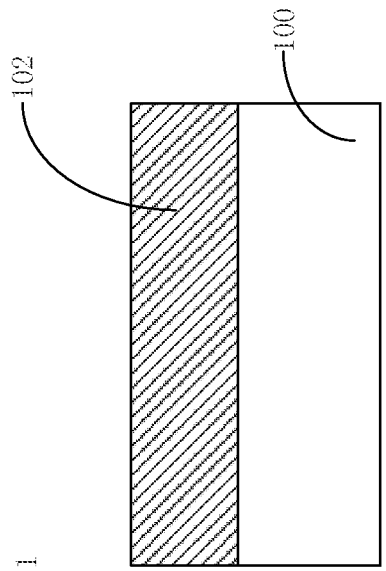
Figures 1, 1C:
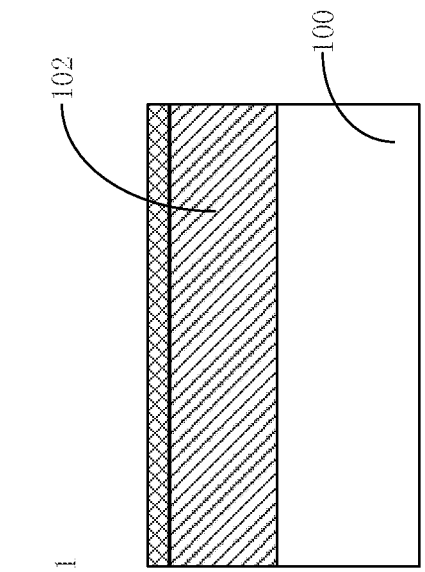
Figures 1, 1C, 2:
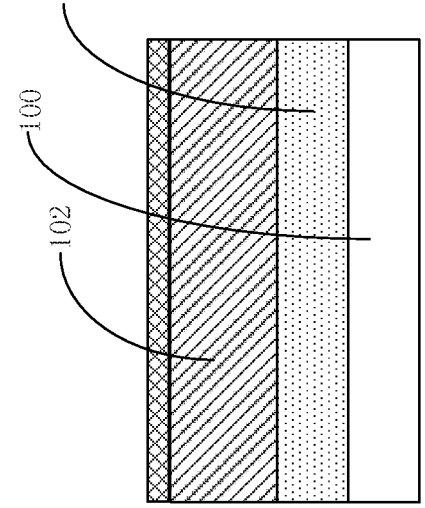
Figures 1, 1C, 2, 3:
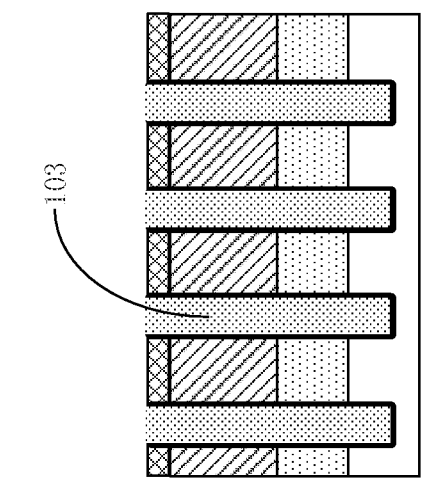
Figures 1, 1D, 2, 3:
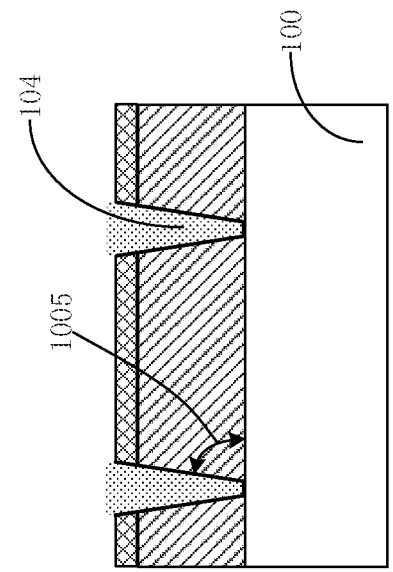
Figures 1, 1D, 2:
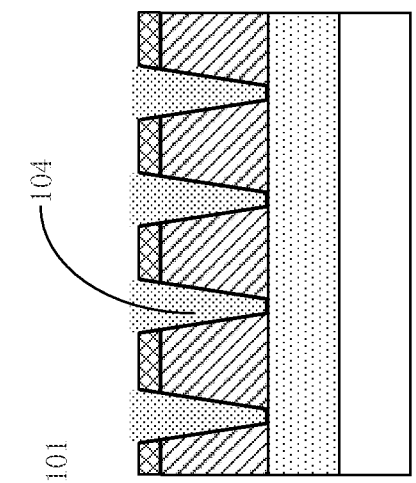
Figures 1, 1D:
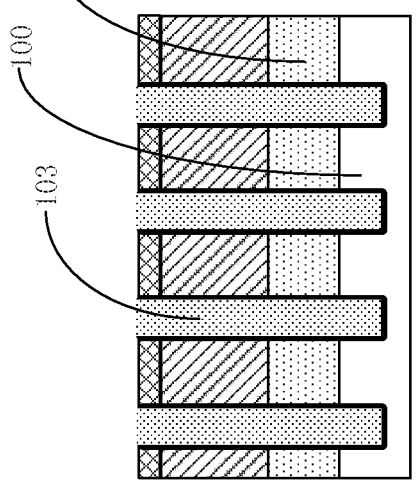
Figures 1, 1F, 2, 3:
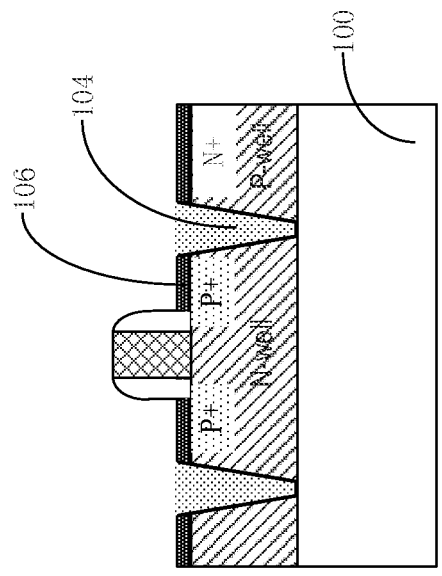
Figures 1, 1F, 2:
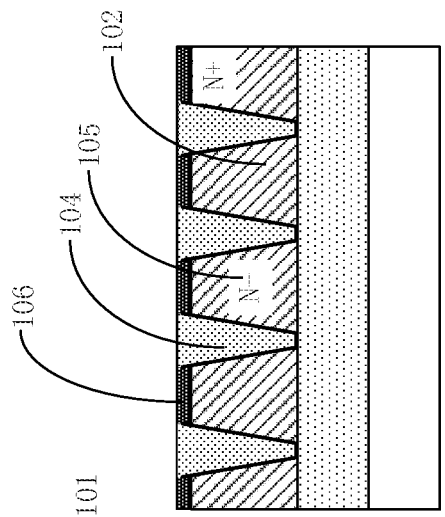
Figures 1, 1F:
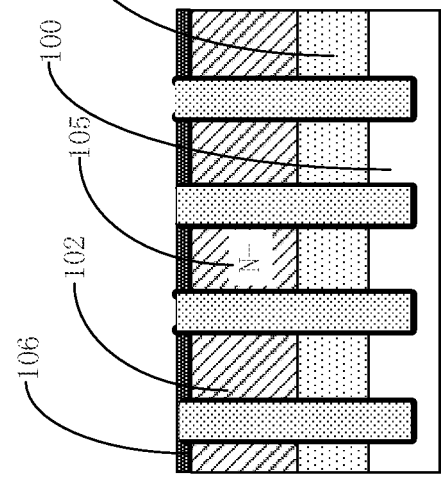
Figure 1H:
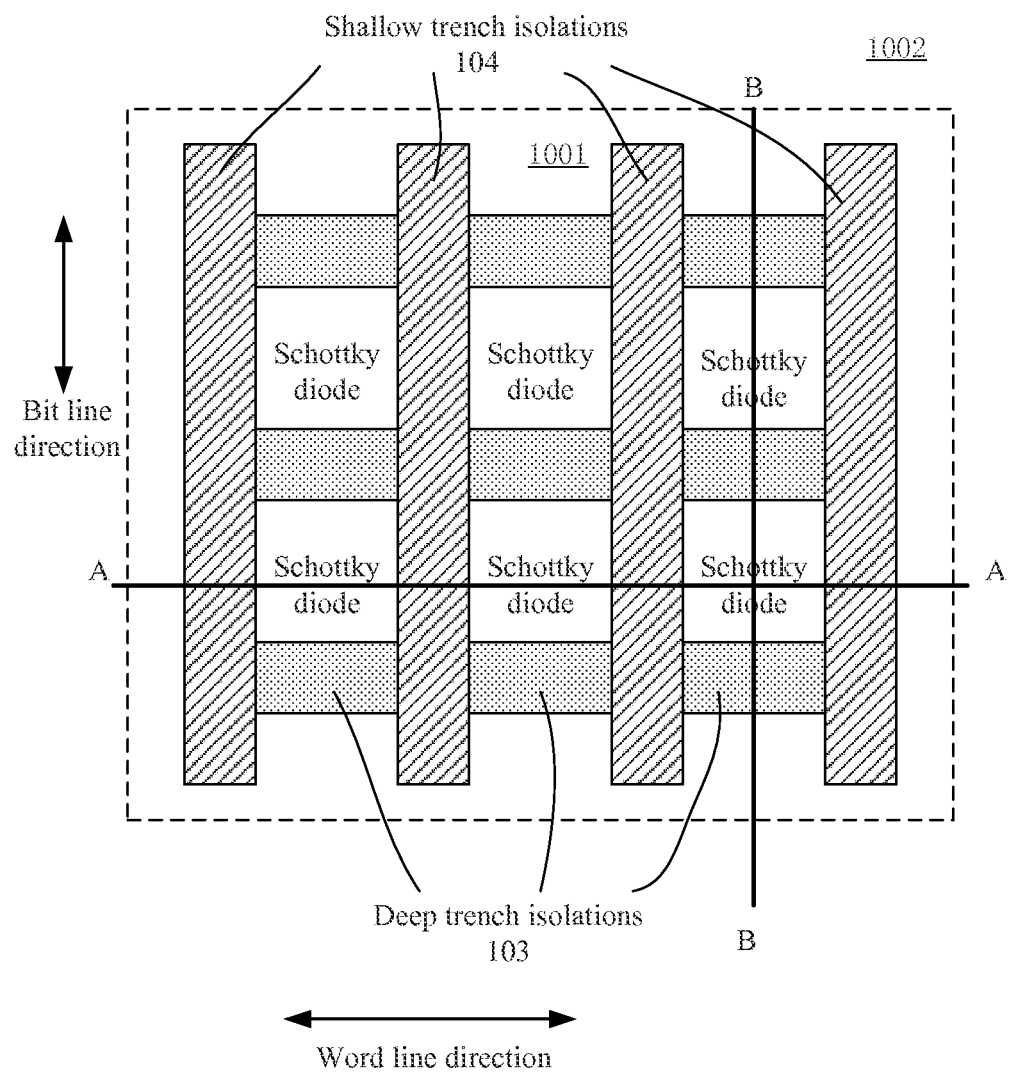
FIG. 1H is a top view of a semiconductor device according to some embodiments of the present invention.

The method also includes forming a semiconductor epitaxial layer 102 overlying the N+ buried layer 101 in the diode array region and the surface of the peripheral device region (step A2), as shown in FIG. 1B.

In an exemplary embodiment, the epitaxial layer 102 may be formed using an epitaxial deposition process. The epitaxial layer 102 has a thickness of about 1000 angstroms to about 6000 angstroms.

The method also includes forming deep trench isolations 103 in the diode array region along the row direction (see FIG. 1H), the deep trench isolations 103 go through at least epitaxial layer 102 and buried N+ layer 101, as shown in FIG. 1C-1 (step A3).

In an exemplary embodiment, forming deep trench isolations 103 may include the following steps:

A301: etching the epitaxial layer, the buried N+ layer and a portion of the semiconductor substrate to form deep trenches;

A302: filling the deep trenches with isolation materials. In one embodiment, the deep trenches are filled with an oxide. In another embodiment, the bottom portion of the deep trenches is filled with an undoped polysilicon and the upper portion is filled with an oxide.

A302: performing a chemical mechanical polishing (CMP) process on the isolation materials to form the deep trench isolations 103.

The method further includes forming shallow trench isolations 104 in the diode array region and in the peripheral device region along the column direction (step A4), as shown in FIG. 1D and FIG. 1H. The shallow trench isolations 104 go through at least the epitaxial layer 102. In other words, the height or depth of the shallow trench isolations 104 is equal to or greater than the thickness of the epitaxial layer 102.

In one embodiment, the shallow trench isolations 104 may be formed using the following steps:

A401: etch the shallow trenches in the diode array region and in the peripheral device region;

A402: form a liner layer on the shallow trenches;

A403: fill the shallow trenches with an isolation material;

A404: perform a chemical mechanical polishing (CMP) process on the isolation material.

In one embodiment, the liner layer may include an oxide. The isolation material may also include an oxide. In an embodiment, a mask of silicon nitride (SiN) may be formed on the diode array region and the peripheral device region prior to etching to form the shallow trenches.

In an embodiment, the shallow trench isolations 104 have a depth that is less than the depth of the deep trench isolations 103. The depth of the deep trench isolations is in the range between 2000 angstroms and 5000 angstroms. The sidewalls of the shallow trench isolations 104 intercept the surface of substrate 100 at an angle 1005 in a range between 77 degrees and 89 degrees, as shown in FIG. 1D. The liner layer formed on shallow trench isolations has a thickness in the range between 200 angstroms and 600 angstroms. After forming the shallow trenches by etching, the remaining silicon nitride layer has a thickness about 600 angstroms to 1000 angstroms.

The method also include forming an N– doped region 105 in a portion between the deep trench isolations and the shallow trench isolations disposed in the diode array region (step A5), as known in FIG. 1E.

In an exemplary embodiment, step A5 includes the following steps:

A51: form cylindrical-shaped trenches in the vertical direction of the epitaxial layer along the deep trench isolations 103 in a portion between the deep trench isolations 103 and the shallow trench isolations 104 disposed in the diode array region;

A52: perform an ion implantation with N– dopants into the cylindrical-shaped trenches.

In some embodiments, step A5 may include forming P-wells and N-wells in the peripheral device region, gate structures of MOS devices, sidewalls, LDD, and source/drain regions, and N+ layer in the diode array region and in the peripheral device region using process steps associated with the standard process techniques of manufacturing a CMOS device.

In the exemplary embodiment, only one N– doped region 105 disposed between the deep trench isolations and the shallow trench isolations disposed in the diode array region is shown for the sake of clarity. It is understood that the number of N– doped regions 105 can be any integer number.

The method also include forming a metal silicide 106 overlying the N– doped regions 105 disposed within the epitaxial layer 102 (step A6), as shown in FIG. 1F. The metal silicide 106 can be $NiSi_x$, $CoSi_x$, $PtSi_x$, $TiSi_x$, where x is 0.3 to 2 units, or any other suitable materials.

In an embodiment, forming the metal silicide 106 may include first and second rapid thermal annealing (RTA) processes, where the first RTA is performed at a temperature in the range between 200° C. to 450° C. and with a time duration in the range between 10 seconds and 60 seconds, and the second RTA is a spike anneal process at a temperature of about 500° C.

The method additionally include forming bit lines 108 and word lines 110. Bit lines 108 are connected with metal silicide 106, and word lines 110 are connected with N+ buried layer 102, as shown in FIG. 1G.

In an exemplary embodiment, bit lines 108 are connected with metal silicide 106 through contact holes 107. Word lines 110 are connected with N+ buried layer 102 through contact holes 109, a metal layer that is disposed in the same layer as bit lines 108, and contact holes similar to contact holes 107.

In some embodiments, method 300 may also include, between steps A5 and A6, performing an ion implantation into a region of the epitaxial layer 102 in the diode array region to adjust the barrier height of the Schottky diodes. The ion implantation may include dopants such as B, $BF_2$, As, or Sb with a dose of $1.0\times10^{12}$ to $4.0\times10^{14}$ atoms per $cm^2$.

In an embodiment, metal silicide 106, N– doped region 105 in epitaxial layer 102, and N+ buried layer 101 form Schottky diodes. Each Schottky diode is surrounded by deep trench isolations 103 and shallow trench isolations 104, as shown in FIG. 1H. In other words, each Schottky diode is isolated and separated from adjacent Schottky diodes by two deep trench isolations and two shallow trench isolations.

Embodiments of the present invention provide methods of manufacturing Schottky diodes using standard CMOS fabrication processes to reduce production costs. Because the Schottky diodes are isolated from each other by the deep trench isolations and shallow trench isolations, a phase change random access memory device having such Schottky diodes as selectors has low turn-on voltage, low cross-talk current, and high switching speed. Because of the low turn-on voltage, such phase change random access memory device has a low power consumption.

In a specific embodiment, in order to reduce the reverse leakage current of the Schottky diodes, step A4 may further include the following steps as illustrated in FIGS. 2A through 2D. FIGS. 2A through 2D illustrate simplified cross-sectional views along the word line direction of various process stages associated with forming shallow trench isolations, in accordance with an embodiment of the present invention.

Figure 2A:
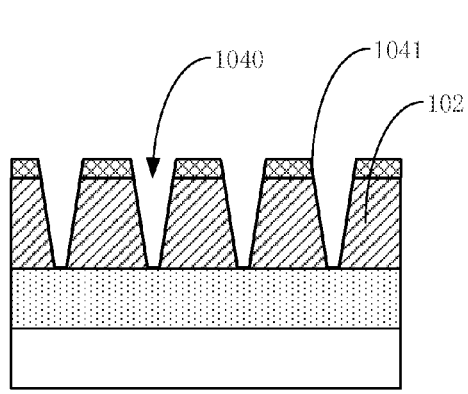
FIGS. 2A through 2D illustrate simplified cross-sectional views of various process stages associated with forming a shallow trench isolation of a semiconductor device of the first embodiment.

In an embodiment, the shallow trench isolations may be formed using the following steps:

B41: form shallow trenches 1040 within the epitaxial layer 102 disposed in the diode array region and in the peripheral device region, form a liner layer 1041 overlying the shallow trenches 1040, as shown in FIG. 2A. Shallow trenches 1040 may be formed by etching. The liner layer 1041 may be formed with an oxidation process, so that the liner layer 1041 includes an oxide.

Figure 2B:
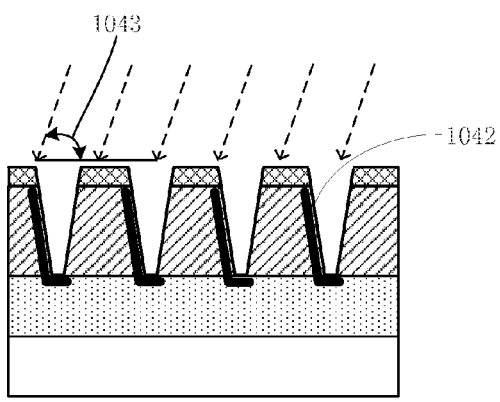
Figure 2C:
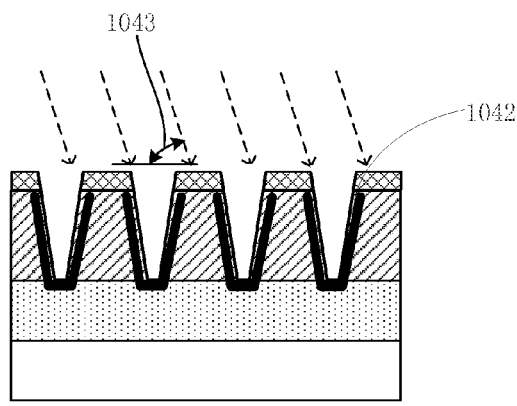

B42: perform an ion implantation into the liner layer 1041 to form a P+ protective layer 1042, as shown in FIGS. 2B and 2C. In other words, the P+ protective layer 1042 is formed on the bottom and the side surfaces of the shallow trench isolations.

In an embodiment, the ion implantation is conducted with a selected implant angle 1043 relative to the surface of the substrate to ensure a better effect of the ion implantation, as shown in FIGS. 2B and 2C. In an embodiment, the ion implantation is conducted with implant ions such as boron (B), boron fluoride (BF2), or indium (In), with an energy in the range between 5 KeV and 20 KeV, a dose of about $1.0\times10^{12}$ to $4.0\times10^{15}$ per $cm^2$, and an implant angle between 45 degrees and 75 degrees.

B43: subject the P+ protective layer 1042 to an annealing process. The annealing process may be performed at a temperature of about 950° C. to 1100° C. for a time duration of 10 seconds and 3600 seconds.

Figure 2D:
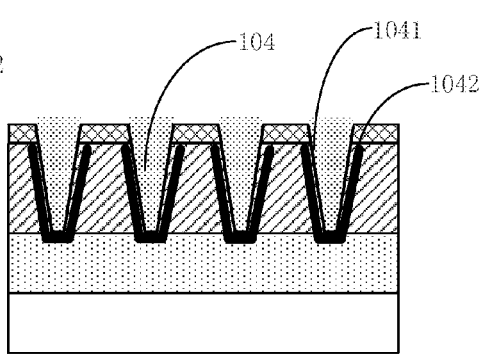
Figure 3:
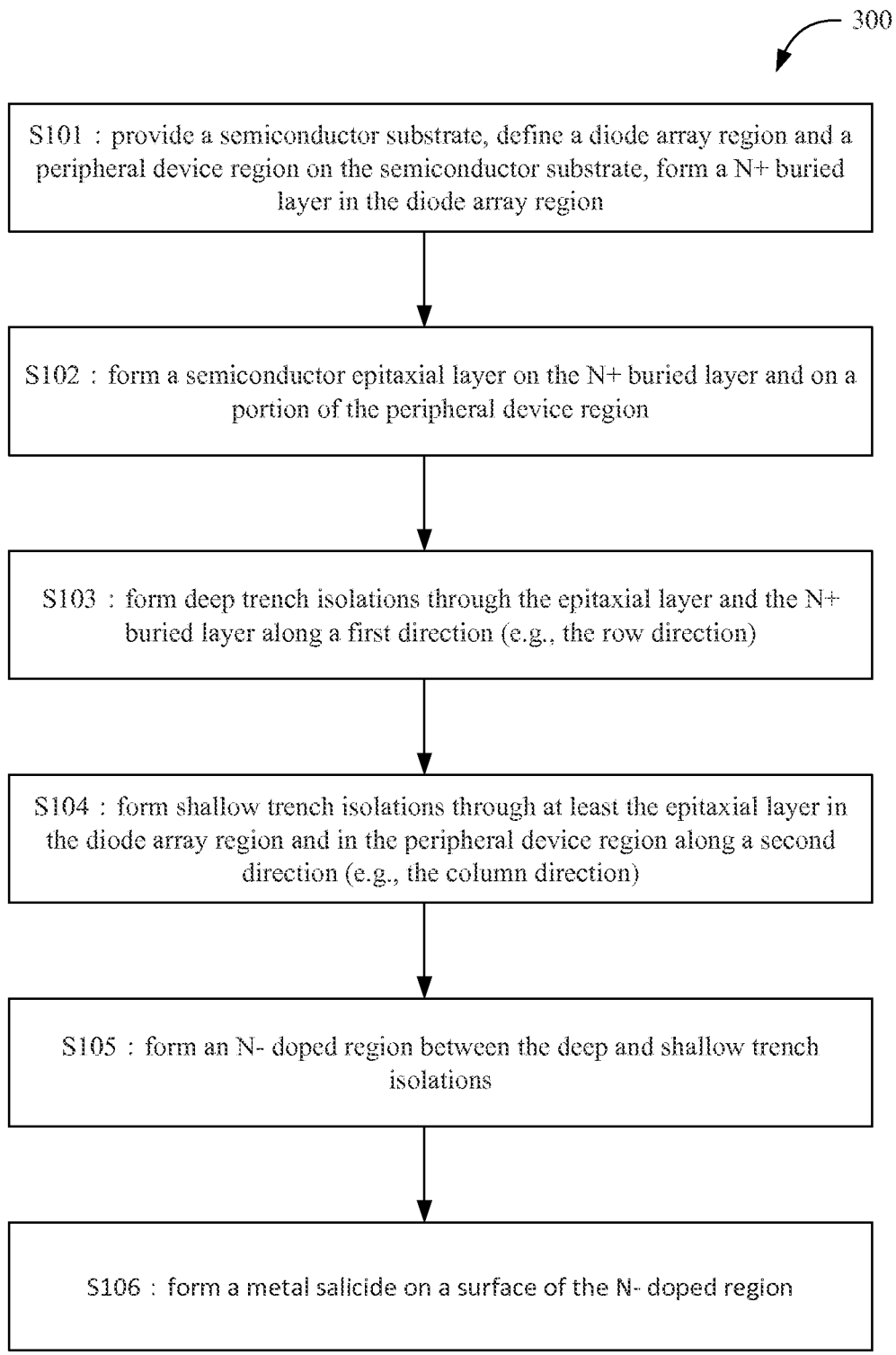
FIG. 3 is a simplified flow chart of a method of manufacturing a semiconductor device according to an embodiment of the present invention.

B44: fill the shallow trenches 1040 with an isolation material and perform a chemical mechanical polishing (CMP) process on the isolation material to form the shallow trench isolations 104, as shown in FIG. 2D.

Because the shallow trench isolations 104 have a P+ protective layer 1042 at the bottom and at the surface of the sidewalls, the Schottky diodes have a low reverse leakage current with the subsequent formed N– doped region 105 so that the performance of the semiconductor device is improved.

FIG. 3 is a flow chart of a method 300 for manufacturing a semiconductor device according to an embodiment of the present invention. Method 300 includes:

S101: provide a P-type semiconductor substrate, define a diode array region and a peripheral device region on the semiconductor substrate, and form a N+ buried layer on the diode array region;

S102: form a semiconductor epitaxial layer on the N+ buried layer and on a portion of the peripheral device region;

S103: form deep trench isolations along the row direction in the diode array region, the deep trench isolations go through at least the epitaxial layer and the N+ buried layer;

S104: form shallow trench isolations along the column direction in the diode array region and in the peripheral device region, the shallow trench isolations go through at least the epitaxial layer;

S105: form an N– doped region in a portion of the epitaxial layer disposed between the deep trench isolations and the shallow trench isolations;

S106: form a metal silicide overlying the surface of the N– doped region.

Second Embodiment

Figures 3, 4:
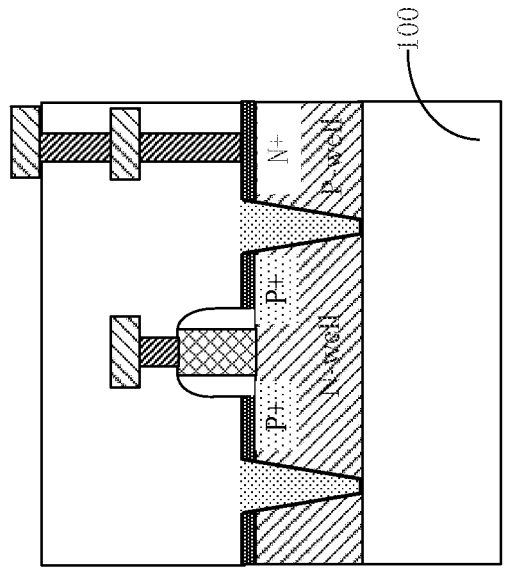
FIG. 4 is a simplified cross-sectional view of a semiconductor device according to a second embodiment of the present invention.
Figures 2, 4:
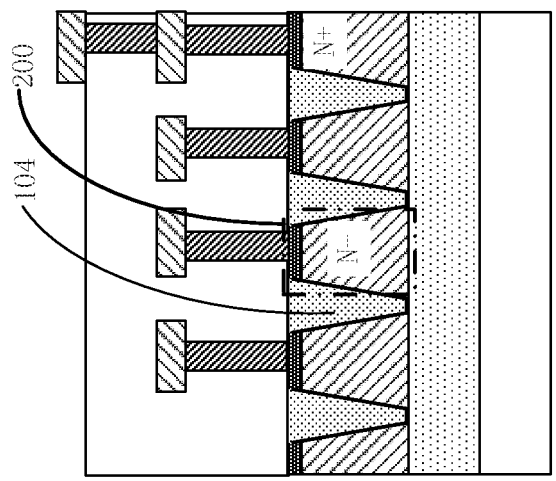
Figures 1, 4:
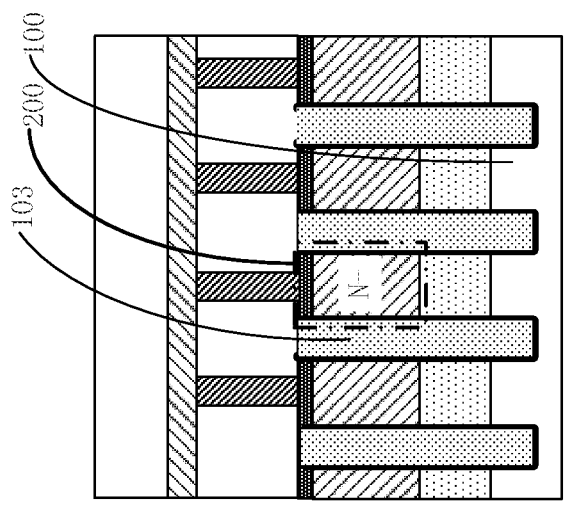

FIG. 4 includes FIGS. 4-1 through 4-3 illustrating simplified cross-sectional views of a semiconductor device according to a second embodiment of the present invention. FIG. 4-1 is a simplified cross-sectional view of a diode array region along the bit line direction. FIG. 4-2 is a simplified cross-sectional view of the diode array region along the word line direction. FIG. 4-3 is a simplified cross-sectional view of a peripheral device region.

Referring to FIGS. 4-1 through 4-3, a semiconductor device includes a p-type semiconductor substrate 100, a diode array region and a peripheral device region defined in semiconductor substrate 100. The diode array region includes a plurality of Schottky diodes 200 as selectors for a phase change memory device and deep trench isolations 103 and shallow trench isolations 104 disposed around the Schottky diodes 200. Each Schottky diode 200 is surrounded by a double isolation structure comprising deep trench isolations 103 and shallow trench isolations 104.

In this embodiment, the peripheral device region is a region for a CMOS device, as shown in FIG. 4-3. Referring to FIGS. 4-1 and 4-2, the area marked by dashed lines includes a Schottky diode 200, however, the area marked by the dashed lines may not include the specific structure of the Schottky diode 200.

Thanks to the double trench isolation structure of the Schottky diodes, a semiconductor device having the Schottky diodes as selectors for the phase-change memory elements exhibits a low turn-on voltage, low crosstalk current and high switching speed.

In a specific embodiment, a semiconductor device may further include a P+ protection layer formed on the bottom and the surface of the sidewalls of the shallow trench isolations to reduce or suppress the reverse leakage current of Schottky diodes, thereby improving the performance of the semiconductor device. The P+ protection layer may include boron (B), boron fluoride (BF2) or Indium (In).

Third Embodiment

An electronic device, in accordance with a third embodiment of the present invention, may include the semiconductor device as described in the second embodiment, which may be manufactured according to the first embodiment. Because the semiconductor device according to the embodiments described above has a low turn-on voltage, low sneak current and fast switching speed, the electronic device according to this embodiment also includes the advantages described above.

The electronic device may be a mobile phone, tablet PC, laptop, netbook, game console, DVD player, GPS device, voice recorder, MP3, MP4, PSP, or other electronic products.

The preferred embodiments of the present invention have been described for illustrative modification purposes, and those skilled in the art will appreciate that various modifications, additions and substitutions are possible, without departing from the scope and spirit of the invention as disclosed in the appended claims.

What is claimed is:

1. A method of manufacturing a semiconductor device having a plurality of Schottky diodes, the method comprising:
    providing a P-type semiconductor substrate;
    defining a diode array region having the plurality of Schottky diodes and a peripheral device region on the P-type semiconductor substrate;
    forming an N+ buried layer in the diode array region;
    forming a semiconductor epitaxial layer on a portion of the peripheral device region and on the N+ buried layer;
    forming a plurality of deep trench isolations through at least the epitaxial layer and the N+ buried layer along a first direction;
    forming a plurality of shallow trench isolations within the diode array region and within the peripheral device region along a second direction, the shallow trench isolations having a depth equal to or greater than a thickness of the epitaxial layer;
    wherein forming a plurality of shallow trench isolations comprises:
        forming a plurality of shallow trenches within the epitaxial layer of the diode array region and within the epitaxial layer of the peripheral device region;
        forming a liner layer overlying the shallow trenches;
        performing an ion implantation into the liner layer to form a P+ protection layer;
        subjecting the P+ protection layer to an annealing treatment;
        filling the shallow trenches with an insulation material; and
        planarizing the insulation material using a chemical mechanical polishing process;
    wherein performing an ion implantation comprises implanting dopants at an energy in a range between 5 KeV and 40 KeV, a dose in a range between $1.0 \times 10^{12}$ to $4.0 \times 10^{15}$ atoms per $cm^2$, and an implant angle in a range of 45 degrees and 70degrees relative to a surface of the semiconductor substrate, the dopants comprising boron, boron fluoride, or indium;
    forming an N− doped region within a region of the epitaxial layer disposed between the deep trench isolations and the shallow trench isolations of the diode array region; and
    forming a metal silicide on the N− doped region.

2. The method of claim 1, wherein forming an N+ buried layer comprises:
    performing an ion implantation into the diode array region to form an N+ doped layer; and
    activating the N+ doped layer.

3. The method of claim 2, wherein the ion implantation has a dose greater than about $1.0 \times 10^{14}$ atoms per $cm^2$.

4. The method of claim 1, wherein forming a semiconductor epitaxial layer comprises:
    depositing a semiconductor epitaxial layer having a thickness in a range between 1000 angstrom and 6000 angstroms.

5. The method of claim 1, wherein the annealing treatment is conducted at a temperature in a range between 950° C. and 1100° C. and a time duration in a range between 10 seconds and 3600 seconds.

6. The method of claim 1, wherein forming an N− doped region comprises:
    etching a portion of the epitaxial layer disposed between the deep trench isolations and the shallow trench isolations to form a plurality of cylindrical-shaped trenches in a vertical direction relative to the epitaxial layer;
    implanting N− ions into the cylindrical-shaped trenches.

7. The method of claim 1, wherein the metal silicide is selected from the group consisting of NiSix, CoSix, PtSix, and TiSix, $0.3 \leq x \leq 2$.

8. The method of claim 1, further comprising, after forming the N− doped region and prior to forming a metal silicide:
    performing an ion implantation into a surface of the diode array region to adjust a barrier height of the Schottky diodes.

9. The method of claim 8, wherein the ion implantation comprises dopants selected from the group consisting of B, $BF_2$, As, and Sb with a dose in a range between $1.0 \times 10^{12}$ and $4.0 \times 10^{14}$ atoms per $cm^2$.

10. The method of claim 1, further comprising, after forming a metal silicide:
    forming bit lines and word lines, wherein the bit lines are connected to the metal silicide through first contact holes, and wherein the word lines are connected to the N+ buried layer through second contact holes.

* * * * *